(12) United States Patent
Arunachalam et al.

(10) Patent No.: US 8,211,794 B2
(45) Date of Patent: Jul. 3, 2012

(54) PROPERTIES OF METALLIC COPPER DIFFUSION BARRIERS THROUGH SILICON SURFACE TREATMENTS

(75) Inventors: Valli Arunachalam, Garland, TX (US); Satyavolu Srinivas Papa Rao, Garland, TX (US); Sanjeev Aggarwal, Scottsdale, AZ (US); Stephan Grunow, Poughkeepsie, NY (US)

(73) Assignee: Texas Instruments Incorporated, Dallas, TX (US)

( * ) Notice: Subject to any disclaimer, the term of this patent is extended or adjusted under 35 U.S.C. 154(b) by 662 days.

(21) Appl. No.: 11/753,926

(22) Filed: May 25, 2007

(65) Prior Publication Data
US 2008/0290515 A1    Nov. 27, 2008

(51) Int. Cl.
*H01L 21/4763* (2006.01)

(52) U.S. Cl. ........ 438/643; 438/761; 438/641; 438/644; 257/751; 257/E21.24; 257/E21.495; 257/E23.154

(58) Field of Classification Search .................. 438/643, 438/761, 641, 644; 257/751, E21.24, E21.495, 257/E23.154
See application file for complete search history.

(56) References Cited

U.S. PATENT DOCUMENTS

| | | | |
|---|---|---|---|
| 6,579,786 B2 | 6/2003 | Schmidbauer et al. | |
| 6,680,249 B2 | 1/2004 | Lu et al. | |
| 6,900,127 B2 | 5/2005 | Papa Rao et al. | |
| 7,037,837 B2 | 5/2006 | Grunow et al. | |
| 2002/0180044 A1* | 12/2002 | Lu et al. | 257/751 |
| 2006/0264066 A1* | 11/2006 | Bartholomew et al. | 438/785 |
| 2007/0152333 A1* | 7/2007 | Lee | 257/751 |
| 2008/0064205 A1* | 3/2008 | Dominguez et al. | 438/653 |

* cited by examiner

*Primary Examiner* — Junghwa M Im
(74) *Attorney, Agent, or Firm* — Alan A. R. Cooper; Warren L. Franz; Frederick J. Telecky, Jr.

(57) ABSTRACT

In accordance with the invention, there are diffusion barriers, integrated circuits, and semiconductor devices and methods of fabricating them. The method of fabricating a diffusion barrier can include providing a dielectric layer, forming a first silicon enriched layer over the dielectric layer by exposing the dielectric layer to a silicon-containing ambient, and forming a barrier layer over the first silicon enriched layer.

21 Claims, 5 Drawing Sheets

PROPERTIES OF METALLIC COPPER DIFFUSION BARRIERS THROUGH SILICON SURFACE TREATMENTS

DESCRIPTION OF THE INVENTION

1. Field of the Invention

The subject matter of this invention relates to methods of fabricating semiconductor devices. More particularly, the subject matter of this invention relates to the methods of improving the properties of metallic copper diffusion barriers by use of silicon enriched layers.

2. Background of the Invention

With the decrease in the size of integrated circuits, the need for copper and low-K materials in the next generation interconnect structures is well recognized. Copper interconnect back-end-of line (BEOL) processing of silicon integrated circuits utilizes either single damascene or dual damascene processing. In damascene processing, metal is inlaid into patterned dielectric layers and chemical mechanical polishing (CMP) processes are used instead of metal etching. In damascene processes, generally, a barrier layer is deposited in a damascene structure that is etched into a dielectric stacked on top of the preceding interconnect copper layer to prevent copper diffusion into the surrounding low-K dielectric. There are several requirements for the barrier layer. Firstly, the barrier layer needs to be thin for mitigating resistance increase in fine lines. Typically the barrier layer is less than 5 nm thick for advanced technology nodes where trench widths are less than 100 nm. Secondly, the barrier layer should be substantially free of pinholes and other fast copper diffusion pathways, as these can limit the barrier properties. Thirdly, there should be good adhesion between the barrier layer and the dielectric layer and also between the barrier layer and the copper interconnect. Lastly, during the barrier layer deposition there is a need to prevent the metallic precursor penetration into the porous dielectric layer as this can cause an increase in electrical leakage between the lines, and a degradation of capacitance characteristics of the interconnect. Conventional barrier layers do not meet all the requirements. For example, pure ruthenium as the barrier layer has poor nucleation and results in columnar growth which does not prevent copper diffusion. Also, adhesion of ruthenium to the dielectric layer is of concern. One conventional solution is to use a bi-layer barrier. However, some bi-layer barriers present a new problem of adhesion between the two barrier layers. In other cases, the use of a bi-layer barrier engenders the use of a thicker barrier layer which would not be advisable from resistance considerations.

Thus, there is a need to overcome these and other problems of the prior art and to provide methods of improving barrier properties.

SUMMARY OF THE INVENTION

In accordance with the present teachings, there is a method of fabricating a diffusion barrier including providing a dielectric layer, forming a first silicon enriched layer over the dielectric layer by exposing the dielectric layer to a silicon-containing ambient, and forming a barrier layer over the first silicon enriched layer.

According to various embodiments of the present teachings, there is a method of making an integrated circuit. The method can include forming a damascene opening in a dielectric layer and forming a barrier layer over the dielectric layer. The method can also include forming a silicon enriched layer over the barrier layer and filling the damascene opening with copper.

According to another embodiment of the present teachings, there is a semiconductor device. The semiconductor device can include an inter level layer including one or more of a dielectric material and a low-K dielectric material, a first silicon enriched layer over the inter level layer, and a barrier layer over the first silicon enriched layer.

Additional advantages of the embodiments will be set forth in part in the description which follows, and in part will be obvious from the description, or may be learned by practice of the invention. The advantages will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate embodiments of the invention and together with the description, serve to explain the principles of the invention.

DESCRIPTION OF THE EMBODIMENTS

Reference will now be made in detail to the exemplary embodiments, examples of which are illustrated in the accompanying drawings. Wherever possible, the same reference numbers will be used throughout the drawings to refer to the same or like parts.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less that 10" can assume negative values, e.g. $-1$, $-2$, $-3$, $-10$, $-20$, $-30$, etc.

The term "interconnect" is used interchangeably herein with terms including interconnect line, metal lines, trace, wire, conductor, signal path, and signaling medium. Interconnects are generally made of aluminum, copper, or an alloy of copper and aluminum. Interconnects are conductors that provide signal paths for coupling or interconnecting electrical circuitry. Conductors other than the above mentioned metals include, for example, doped polysilicon, doped single crystal silicon, titanium, molybdenum, tungsten, and refractory metal silicides. As used herein, surface coverage of "a monolayer" of an adsorbate refers to the maximum attainable surface concentration of the adsorbed species bound to the substrate, wherein the adsorbed species can be chemisorbed or physisorbed on the substrate. For example, a surface coverage of "one-tenth of a monolayer" corresponds to one-tenth of the maximum attainable surface concentration of the adsorbed species bound to the substrate and so on.

Figure 1A:
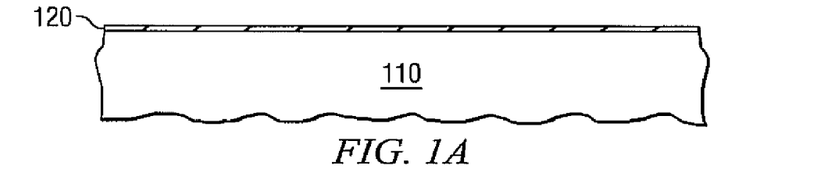
FIGS. 1A-1D are schematic illustrations of an exemplary method for fabricating a diffusion barrier in accordance with various embodiments of the present teachings.

FIGS. 1A-1D are schematic illustrations of an exemplary method for fabricating a diffusion barrier 101 in a semiconductor device 100, according to the present teachings. The method can include providing a dielectric layer 110, forming a first silicon enriched layer 120 over the dielectric layer 110, as shown in FIG. 1A. In various embodiments, the dielectric layer 110 can be formed of a porous low-K dielectric material. In some embodiments, the dielectric layer 110 can be formed of one or more of silicon oxide, organo silicate glass, and fluorine-doped silicate glass. The dielectric layer 110 can have a thickness from about 0.01 µm to about 100 µm, and in some cases from about 0.15 µm to about 2 µm. The dielectric layer 110 can be formed by any suitable method including, for example, chemical vapor deposition, physical vapor deposition, low pressure chemical vapor deposition, atmospheric pressure chemical vapor deposition, plasma enhanced chemical vapor deposition, and spin-on materials. In various embodiments, the first silicon enriched layer 120 can be deposited by exposing the dielectric layer 110 to a silicon-containing ambient such as, for example, silane and hydrogen. In some other embodiments, the first silicon enriched layer 120 can be deposited by exposing the dielectric layer 110 to a silicon-containing ambient at a temperature from approximately 200° C. to approximately 400° C. Exemplary silicon-containing gases include, but are not limited to silane (SiH4), disilane (Si2H6), and tetramethylsilane (Si(CH4)4). In some embodiments, the use of energy-assisted deposition processes, such as, for example, plasma enhanced chemical vapor deposition and plasma enhanced atomic layer deposition can reduce the processing temperature to approximately 300° C. or less. In some embodiments, the thermal decomposition of silane with hydrogen as the carrier gas can reduce copper oxide at the bottom of the metal lines and vias, and thereby can reduce via chain resistance. In various embodiments, the first silicon enriched layer 120 can have a surface coverage from approximately one-tenth of a monolayer to approximately five monolayers and in some cases from approximately one-fifth of a monolayer to approximately two monolayers.

Figure 1B:
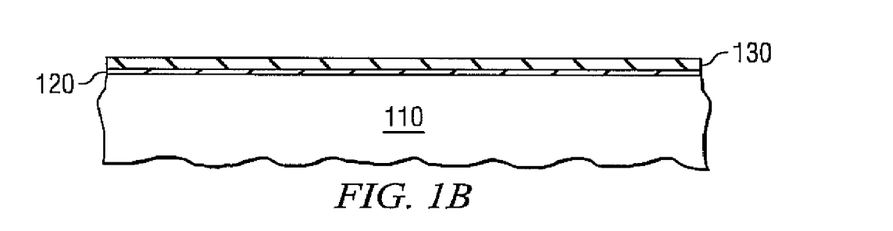
Figure 1C:
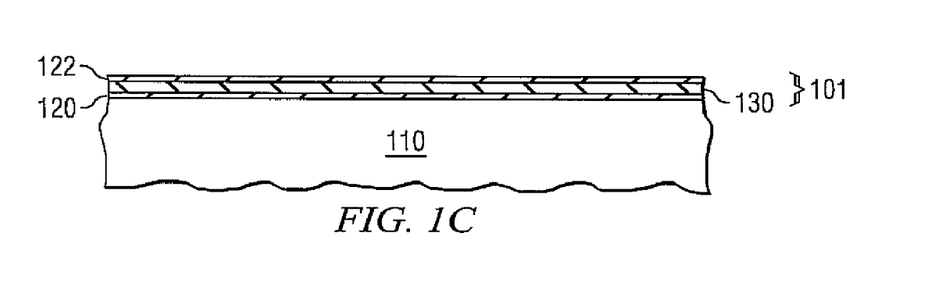
Figure 1D:
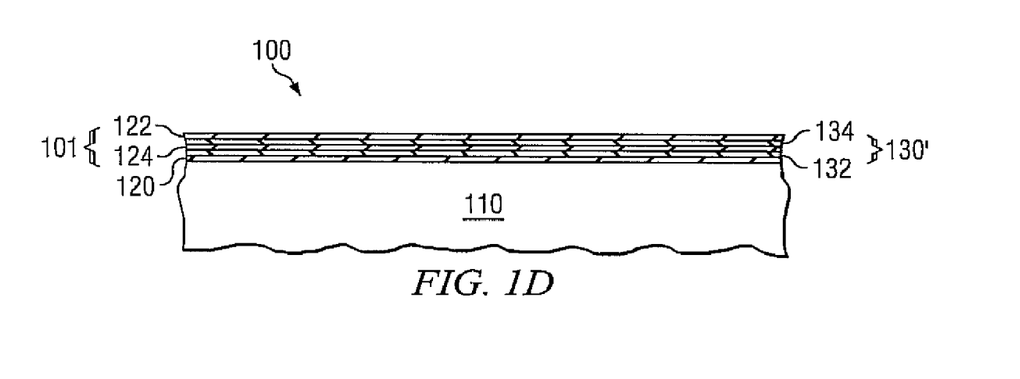

The method for fabricating a diffusion barrier 101 can also include forming a barrier layer 130 over the first silicon enriched layer 120 as shown in FIG. 1B. In some embodiments, the method for fabricating a diffusion barrier 101 can also include depositing a second silicon enriched layer 122 over the barrier layer 130 as shown in FIG. 1C. In some embodiments, the step of forming a barrier layer 130 can include depositing one or more of ruthenium, iridium, rhodium, palladium, tantalum, tantalum nitride, tungsten carbonitride, tungsten nitride, and combinations thereof. In various embodiments, the step of forming a barrier layer 130 over the first silicon enriched layer 120 can include forming a bi-layer barrier 130' as shown in FIG. 1D, including forming a first barrier layer 132 over the first silicon enriched layer 120, forming an intermediate silicon enriched layer 124 over the first barrier layer 132, and forming a second barrier layer 134 over the intermediate silicon enriched layer 124. In other embodiments, the first barrier layer 132 and the second barrier layer 134 can be formed of one or more of ruthenium, iridium, rhodium, palladium, tantalum, tantalum nitride, tungsten carbonitride, tungsten nitride, and combinations thereof. In some other embodiments, the barrier layer 130, the first barrier layer 132, and the second barrier layer 134 can be formed of a combination of materials including, but not limited to, tantalum nitride/ruthenium and tantalum nitride/tantalum. The barrier layer 130, the first barrier layer 132, and the second barrier layer 134 can be formed by any suitable method including, but not limited to, atomic layer deposition, chemical vapor deposition, physical vapor deposition, and sputtering. In some embodiments, the barrier layer 130 and the bi-layer barrier 130' can have a thickness from about 1 nm to about 10 nm, and in some cases from about 1 nm to about 5 nm. In various embodiments, the first silicon enriched layer 120 can prevent the incorporation of the metallic precursors of the barrier layer deposition in the mesoporous dielectric layer 110 by enhancing the nucleation rate of the barrier layer and thereby sealing the surface pores of the mesoporous dielectric layer 110 before significant exposure to the metallic precursors can occur. In some embodiments, the presence of the silicon enriched layer 122 over the barrier layer 130 and the b-layer barrier 130' can improve the barrier properties of the barrier layer 130 and the bi-layer barrier 130' by filling and/or covering the grain-boundaries of the barrier layer 130 and the bi-layer barrier 130' and thereby reducing the copper diffusion rates. In other embodiments, the presence of the silicon enriched layer 122 over the barrier layer 130 and the bi-layer barrier 130' can result in an improved adhesion of the copper seed layer, such as, for example, when tantalum nitride is the barrier layer 130 or the second barrier layer 134.

Figure 2A:
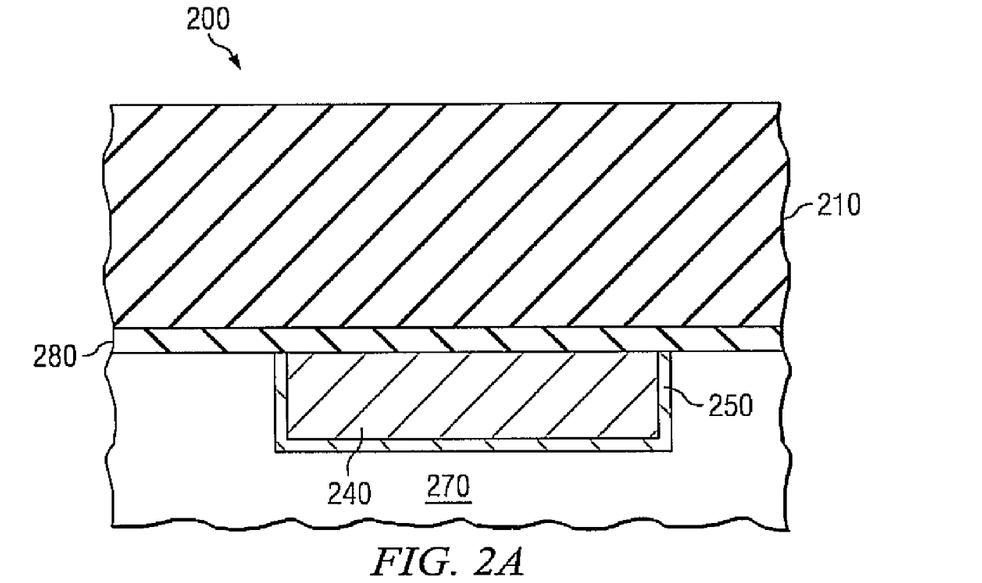
FIGS. 2A-2G depict schematic illustrations of an exemplary method for making an integrated circuit according to various embodiments of the present teachings.

FIGS. 2A-2G depict schematic illustrations of an exemplary method for making an integrated circuit 200, according to various embodiments of the present teachings. The method can include forming a semiconductor structure 270 including one or more copper interconnects 240. In some embodiments, the method can include forming a metal barrier layer 250 on the bottom and sidewalls of the copper interconnect 240 as shown in FIG. 2A. The method for making an integrated circuit 200 can further include forming an etch stop layer 280 over the semiconductor structure 270, and forming a dielectric layer 210 over the etch stop layer 280, as shown in FIG. 2A. In certain embodiments, the step of forming an etch stop layer 280 over the semiconductor structure 270 can include depositing one or more of an oxygen doped silicon carbide layer, a nitrogen doped silicon carbide layer, and a silicon nitride layer over the semiconductor structure 270. The etch stop layer 280 can be deposited by any suitable method including, but not limited to, chemical vapor deposition, physical vapor deposition, low pressure chemical vapor deposition, atmospheric pressure chemical vapor deposition, plasma enhanced chemical vapor deposition, and atomic layer deposition. The etch stop layer 280 can have a thickness from about 1 nm to about 100 nm, and in some cases from about 10 nm to about 50 nm. In some embodiments, the step of forming a dielectric layer 210 over the thin etch stop layer 280 can include depositing an ultra low-k dielectric layer over the thin etch stop layer 280. In certain embodiments, depositing a dielectric layer 210 can include depositing silicon oxide or any other suitable dielectric material, such as, for example, spin-on glass (SOG), xerogel, or other low-K dielectric material.

Figure 2B:
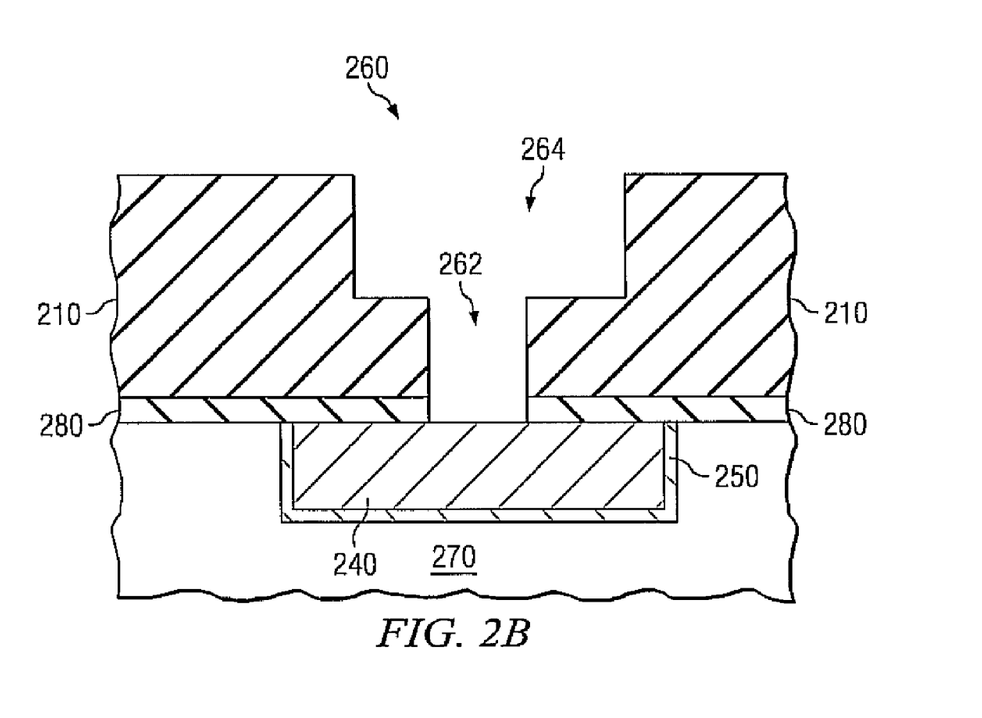
Figure 2C:
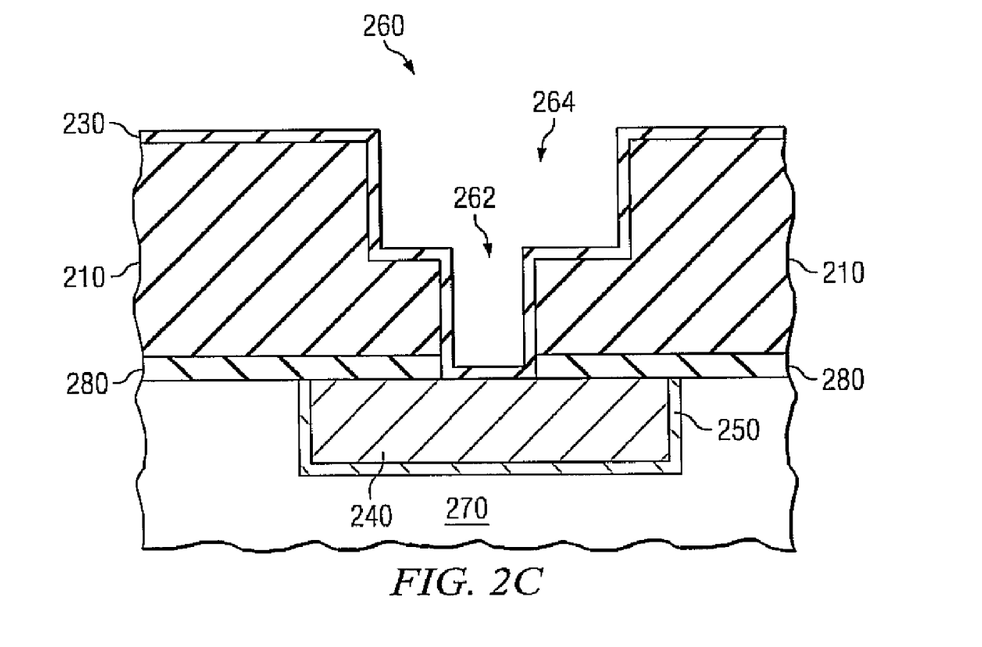

Referring to FIG. 2B, the method of making an integrated circuit 200 can further include forming a damascene opening 260 in the dielectric layer 210 to expose the underlying copper interconnect 240 as shown in FIG. 2B. The damascene opening 260 can include a trench 264 and a via 262. One of ordinary skill in the art will understand that the damascene opening can be formed by any suitable method including, but not limited to, chemical etching, plasma etching, physical (ion milling) etching, and reactive ion etching. The method of making an integrated circuit 200 can also include forming a barrier layer 230 over the dielectric layer 210, as shown in FIG. 2C. In various embodiments, the barrier layer 230 can include multiple barrier layers deposited in several steps, with silicon enriched layer in between the barrier layers. In some embodiments, the barrier layer 230 can be formed of one or more of ruthenium, iridium, rhodium, palladium, tantalum, tantalum nitride, tungsten carbonitride, tungsten nitride, and combinations thereof.

Figure 2D:
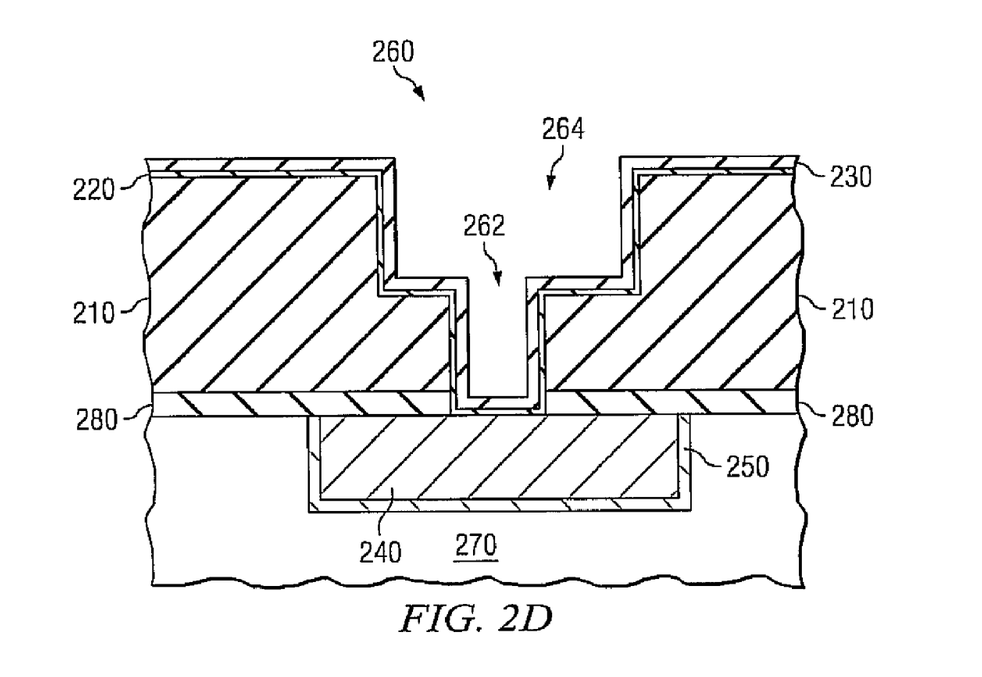
Figure 2E:
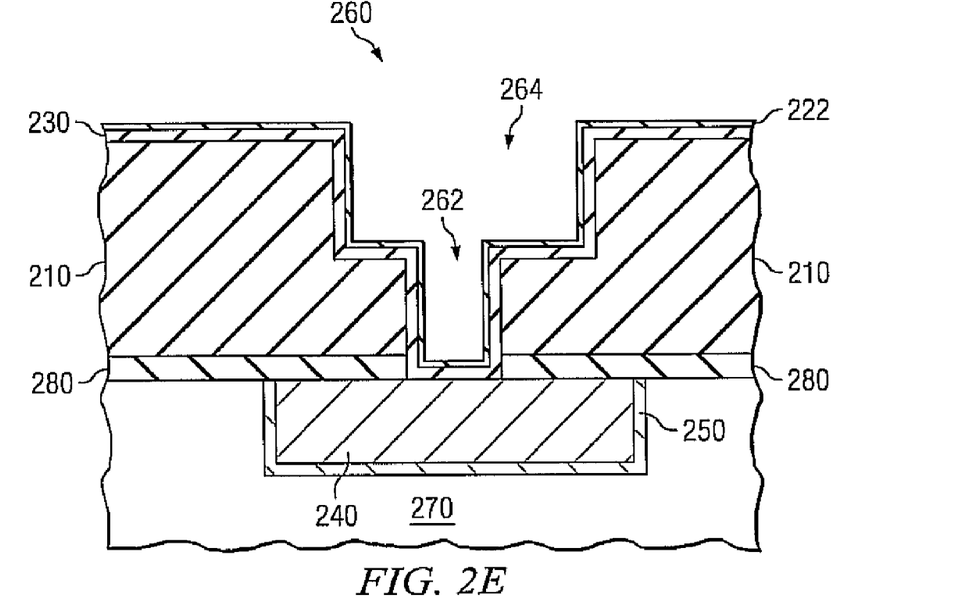

The method of making an integrated circuit 200 can further include forming a silicon enriched layer 222 over the barrier layer 230, as shown in FIG. 2E. In various embodiments, the method of making an integrated circuit 200 can also include forming an another enriched layer 220 over the dielectric layer 210 and under the barrier layer 230, as shown in FIG. 2D. In some embodiments, the silicon enriched layers 222, 220 can be deposited by any suitable method including, but not limited to, one or more of thermal deposition, ion assisted atomic layer deposition, plasma enhanced atomic layer deposition, photon assisted atomic layer deposition, plasma enhanced chemical vapor deposition, and photon assisted chemical vapor deposition. In other embodiments, the silicon enriched layer 222 can be deposited by exposing the barrier layer 230 to a silicon-containing ambient. In some other embodiments, the silicon enriched layer 222 can be deposited by exposing the barrier layer 230 to a silicon-containing ambient and hydrogen at a temperature from approximately 200° C. to approximately 400° C., wherein the silicon containing ambient can include gases selected from the group consisting of silane ($SiH_4$), disilane ($Si_2H_6$), and tetramethylsilane ($Si(CH_4)_4$). In various embodiments, the silicon enriched layer 220 can be deposited by exposing the dielectric layer 210 to a silicon-containing ambient and hydrogen at a temperature from approximately 200° C. to approximately 400° C.

Figure 2F:
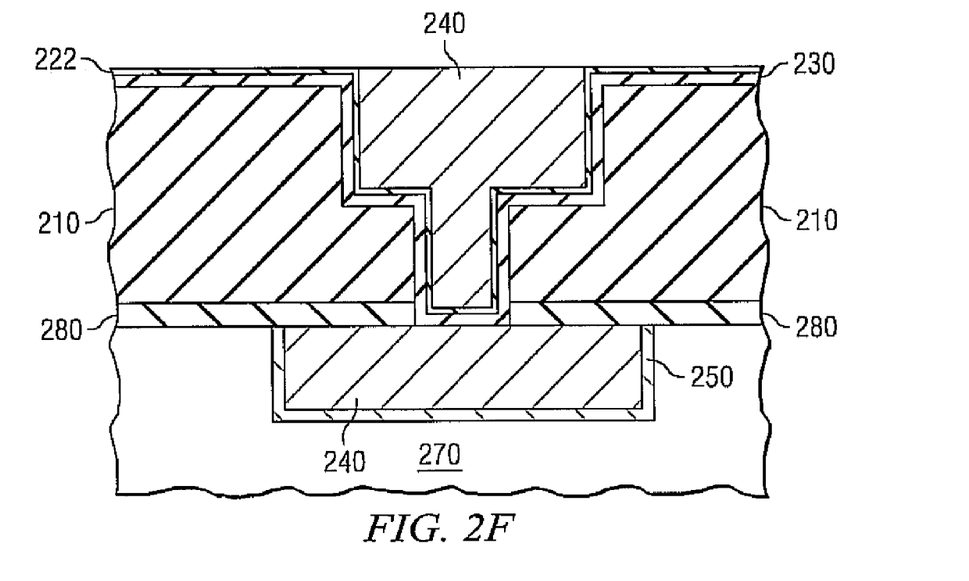
Figure 2G:
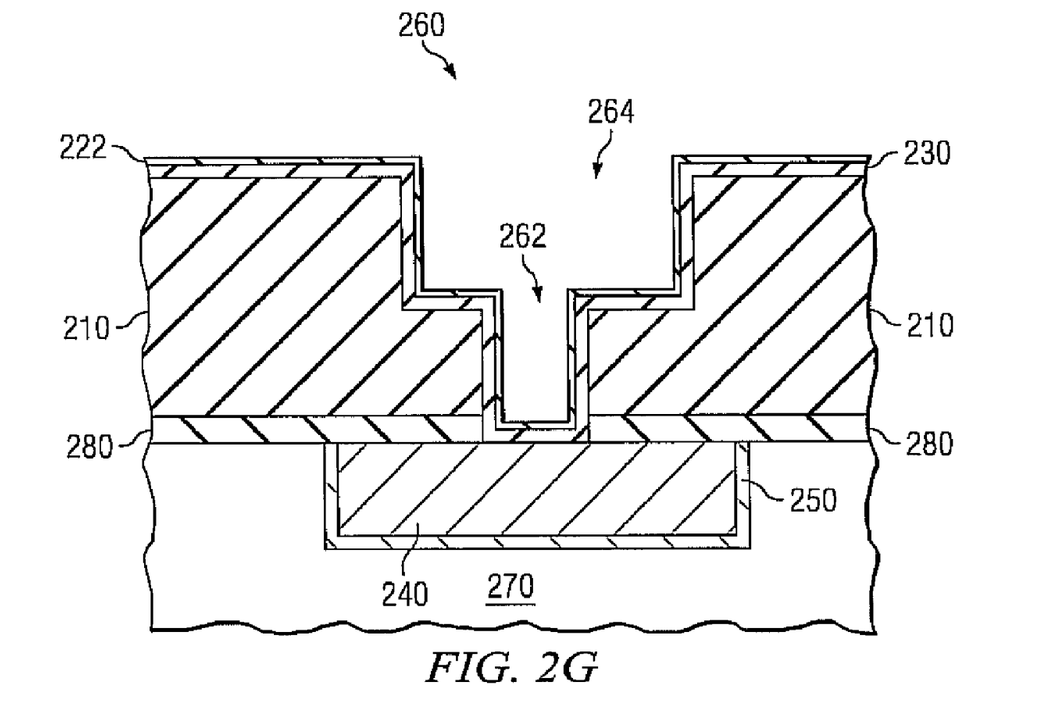

The method of making an integrated circuit 200 can further include filling the damascene opening 260 with copper or copper alloy, as shown in FIG. 2F. Copper filling can be done by any suitable method including, but not limited to, electrochemical plating, electroless plating, and chemical vapor deposition. In some embodiments, the method of making an integrated circuit 200 can also include depositing a copper seed layer (not shown) over the silicon enriched layer 222, to assist in the electrochemical copper fill. The copper seed layer (not shown) can be deposited by any suitable method including, but not limited to, physical vapor deposition, chemical vapor deposition, and atomic layer deposition. One of ordinary skill in the art will understand that the copper fill can be accompanied by planarization such as chemical mechanical polishing to remove excess copper or copper alloy. In some embodiments, the method of making an integrated circuit 200 can further include substantially removing the barrier layer 230 and the silicon enriched layers 220, 222 from the bottom of the via 262 as shown in FIG. 2G to reduce via/contact resistance.

According to various embodiments, there is a semiconductor device 100, as shown in FIG. 1C. The semiconductor device 100 can include an inter level layer 110 including one or more of a dielectric material and a low-K dielectric material, a first silicon enriched layer 120 over the inter level layer 110, and a barrier layer 130 over the first silicon enriched layer 120. In some embodiments, the semiconductor device 100 can also include a second silicon enriched layer 122 over the barrier layer 130. In various embodiments, the barrier layer 130 can include a first barrier layer 132 over the first silicon enriched layer 120, an intermediate silicon enriched layer 124 over the first barrier layer 132, and a second barrier layer 134 over the intermediate silicon enriched layer 124. Yet, in some other embodiments, the barrier layer 130 can include multiple barrier layers with one or more silicon enriched layers in between the barrier layers.

According to various embodiments, the silicon enriched layer 120, 220 can promote substantially amorphous growth of materials such as ruthenium in the barrier layer 130, 230, which could serve as a better barrier for copper diffusion than a barrier layer including crystalline materials and therefore can provide the potential to avoid the use of composite barriers such as, for example, tantalum nitride/ruthenium. Furthermore, the silicon enriched layer 124 can provide improved bi-layer barriers, such as, for example, tantalum nitride/ruthenium and tantalum nitride/tantalum for copper diffusion by improving the adhesion between the two components of the bi-layer barriers. In some embodiments, the silicon-enriched layers 120, 220 over the dielectric layer 110, 210 can assist in pore sealing of the dielectric layer 110, 210. Moreover, the silicon-enriched layers 120, 220 can be deposited in-situ in the barrier deposition chamber and can therefore reduce cost by elimination of a separate tool/chamber and process for pore sealing. Additionally, while most pore-sealing materials need to be removed from the bottom of the via 262 to prevent increase in via resistance, the silicon enriched layer 220, 222 need not be removed as it should not increase via resistance significantly.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising."

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of fabricating a diffusion barrier in a damascene structure, comprising:
    providing a dielectric layer with a damascene opening formed therein to expose an underlying interconnect;
    enriching a surface of the dielectric layer with silicon to form a first silicon enriched dielectric layer at least within the damascene opening by exposing the dielectric layer to silane-containing gas, the silicon enriched dielectric layer providing a surface coverage on the dielectric layer of from approximately one-tenth to approximately five monolayers;
    forming a barrier layer over the first silicon enriched dielectric layer at least within the damascene opening, the barrier layer comprising one or more of ruthenium, iridium, rhodium, palladium, tantalum, tantalum nitride, tungsten carbonitride, tungsten nitride, or combinations thereof;
    depositing a second silicon enriched dielectric layer over the barrier layer; and
    filling the damascene opening with copper or a copper alloy.

2. The method of claim 1, wherein exposing the dielectric layer to the silane-containing gas comprises exposing the dielectric layer to hydrogen and at least one of silane ($SiH_4$), disilane (Si$_2$H$_6$) or tetramethylsilane (Si(CH$_4$)$_4$), at a temperature of from approximately 200° C. to approximately 400° C.

3. The method of claim 1, further comprising enriching a surface of the barrier layer with silicon at least within the damascene opening by exposing the barrier layer to silane-containing gas.

4. The method of claim 1, wherein the step of forming a barrier layer over the silicon enriched dielectric layer comprises:
  a.) forming a first barrier layer over the silicon enriched dielectric layer;
  b.) enriching a surface of the first barrier layer with silicon at least within the damascene opening by exposing the barrier layer to silane-containing gas, the silicon providing a surface coverage on the barrier layer of from approximately one-tenth to approximately five monolayers; and
  c.) forming a second barrier layer over the silicon enriched first dielectric layer.

5. The method of claim 1, wherein at least one of the step of forming the first barrier layer or the step of forming the second barrier layer comprises depositing ruthenium.

6. The method of claim 1, wherein the first silicon enriched layer substantially prevents the incorporation of metallic precursors of a barrier layer deposition into the dielectric layer by enhancing a nucleation rate of the barrier layer, thereby sealing surface pores of the dielectric layer before an exposure to metallic precursors occurs.

7. The method of claim 1, wherein the second silicon enriched layer fills and/or covers grain-boundaries of the barrier layer, thereby reducing copper diffusion rates of the copper or copper alloy.

8. The method of claim 1, wherein said first silicon enriched layer promotes substantially amorphous growth of ruthenium in the barrier layer.

9. The method of claim 4, wherein the step of forming the second barrier layer comprises depositing one or more of ruthenium, iridium, rhodium, palladium, tantalum, tantalum nitride, tungsten carbonitride, tungsten nitride, or combinations thereof.

10. A method of making an integrated circuit comprising:
  forming a damascene opening in a dielectric layer;
  enriching a surface of the dielectric layer at least within the damascene opening by exposing the dielectric layer to silane-containing gas to form a first silicon enriched dielectric layer, the silicon providing a surface coverage on the dielectric layer of from approximately one-tenth to approximately five monolayers;
  forming a barrier layer over the silicon formed on the first silicon enriched dielectric layer at least within the damascene opening, the barrier layer comprising one or more of ruthenium, iridium, rhodium, palladium, tantalum, tantalum nitride, tungsten carbonitride, tungsten nitride, or combinations thereof; and
  depositing a second silicon enriched dielectric layer over the barrier layer; and
  after forming the barrier layer and the second silicon enriched dielectric layer, filling the damascene opening with copper;
  wherein the step of forming a barrier layer over the dielectric layer comprises
    forming a bi-layer barrier comprising forming a first barrier layer over the silicon formed on the dielectric layer; which includes:
      a) enriching the first barrier layer with silicon by exposing the first barrier layer at least within the damascene opening to silane-containing gas; and
      b) forming a second barrier layer over the silicon formed on the first barrier layer.

11. The method of claim 10, further comprising enriching a surface of the barrier layer with silicon at least within the damascene opening by exposing the barrier layer to silane-containing gas, the silicon providing a surface coverage on the barrier layer of from approximately one-tenth to approximately five monolayers.

12. The method of claim 10, wherein the step of forming the barrier layer over the silicon formed on the dielectric layer comprises depositing ruthenium.

13. The method of claim 10, wherein the step of enriching the dielectric layer with silicon comprises thermal deposition of silicon using the silane-containing gas with hydrogen.

14. The method of claim 10, wherein the step of enriching the dielectric layer with silicon comprises depositing the silicon by exposing the dielectric layer to silane (SiH$_4$), disilane (Si$_2$H$_6$), tetramethylsilane (Si(CH$_4$)$_4$), or other silane-containing gas together with hydrogen, at a temperature of from approximately 200° C. to approximately 400° C.

15. The method of claim 10, wherein the step of filling the damascene opening with copper comprises depositing copper by electrochemical deposition.

16. A method of making an integrated circuit comprising:
  forming a semiconductor structure including a copper interconnect;
  forming a dielectric layer of porous low-K dielectric material over the copper interconnect;
  forming a damascene opening in a dielectric layer to expose the copper interconnect;
  enriching a surface of the dielectric layer to form a first silicon enriched dielectric layer at least within the damascene opening by exposing the dielectric layer to a silane gas after forming the damascene opening, the silicon enriched dielectric layer providing a surface coverage on the first silicon enriched dielectric layer of from approximately one-tenth to approximately five monolayers;
  forming a barrier layer comprising ruthenium at least in the damascene opening after exposing the first silicon enriched dielectric layer to the silane gas; and
  depositing a second silicon enriched dielectric layer over the barrier layer; and
  after forming the barrier layer and the second silicon enriched dielectric layer, filling the damascene opening with a material comprising copper,
  wherein the first silicon enriched layer substantially prevents the incorporation of metallic precursors of a barrier layer deposition into the dielectic layer by enhancing a nucleation rate of the barrier layer, and thereby sealing surface pores of the dielectric layer before an exposure to metallic precursors occurs, and
  wherein the second silicon enriched layer fills and/or covers grain-boundaries of the barrier layer, thereby reducing copper diffusion rates of the copper or copper alloy.

17. The method of claim 16, wherein the silane gas comprises at least one of silane (SiH$_4$), disilane (Si$_2$H$_6$), or tetramethylsilane (Si(CH$_4$)$_4$).

18. The method of claim 16, further comprising exposing the barrier layer at least within the damascene opening to silane gas prior to filling the damascene opening with the material comprising copper.

19. The method of claim 16, wherein the silane gas to which the dielectric layer is exposed and to which the barrier layer is exposed includes at least one of silane (SiH$_4$), disilane (Si$_2$H$_6$), or tetramethylsilane(Si(CH$_4$)$_4$).

20. The method of claim 17, wherein the dielectric layer is exposed to the silane gas at a temperature of 200° C. to 400° C.

21. The method of claim 18, wherein the barrier layer is a first barrier layer; and further comprising forming a second barrier layer over the first barrier layer at least within the damascene opening after exposing the first barrier layer to the silane gas and prior to filling the damascene opening with the material comprising copper.

* * * * *